United States Patent [19]
Kumagai et al.

[11] Patent Number: 5,276,343
[45] Date of Patent: Jan. 4, 1994

[54] SEMICONDUCTOR MEMORY DEVICE HAVING A BIT LINE CONSTITUTED BY A SEMICONDUCTOR LAYER

[75] Inventors: Jumpei Kumagai; Shizuo Sawada, both of Yokohama, Japan

[73] Assignee: Kabushiki Kaisha Toshiba, Kawasaki, Japan

[21] Appl. No.: 943,144

[22] Filed: Sep. 10, 1992

Related U.S. Application Data

[63] Continuation of Ser. No. 687,698, Apr. 19, 1991, abandoned.

[30] Foreign Application Priority Data

Apr. 21, 1990 [JP] Japan .................. 2-105911

[51] Int. Cl.$^5$ .................................. H01L 29/78
[52] U.S. Cl. .................................. 257/306; 257/296; 257/302
[58] Field of Search ............ 357/23.6; 257/296, 302, 257/306

[56] References Cited

U.S. PATENT DOCUMENTS

| | | | |
|---|---|---|---|
| 4,630,088 | 12/1986 | Ogura et al. ............... | 357/55 |
| 4,829,017 | 5/1989 | Malhi ........................ | 437/52 |
| 4,845,537 | 7/1989 | Nishimura et al. ....... | 357/23.6 |
| 4,914,739 | 4/1990 | Malhi ........................ | 357/23.6 G |
| 4,974,060 | 11/1990 | Ogasawara ............... | 357/23.6 G |

FOREIGN PATENT DOCUMENTS

| | | |
|---|---|---|
| 042084 | 12/1981 | European Pat. Off. |
| 1-198065 | 11/1989 | Japan |
| 1-248557 | 12/1989 | Japan |
| 2-26066 | 3/1990 | Japan |

OTHER PUBLICATIONS

IBM Technical Disclosure Bulletin, vol. 23, No. 9, pp. 4052–4053, published Feb., 1981, Kenny, "Reduced Bit Line Capacitance in VDMOS Devices".

IEDM Technical Digest., p. 714 (1985), W. F. Richardson, et al "A Trench Transistor Cross-Point Dram Cell".

IEDM Technical Digest., p. 39 (1989), T. E. Tang. "In-Situ Doped Polysilicon Using Vapor Dorant for High Density DRAMs".

*Primary Examiner*—William Mintel
*Assistant Examiner*—Robert Limanek
*Attorney, Agent, or Firm*—Banner, Birch, McKie & Beckett

[57] ABSTRACT

A DRAM cell having a bit line constituted by a semiconductor layer. The DRAM cell comprises a semiconductor substrate of a first conductivity type having a main surface, an insulating film formed on the main surface, an opening formed in the insulating film to communicate with the substrate, and a bit line formed by a semiconductor layer of a second conductivity type formed on the insulating film and that portion of the substrate which is exposed through the opening.

6 Claims, 17 Drawing Sheets

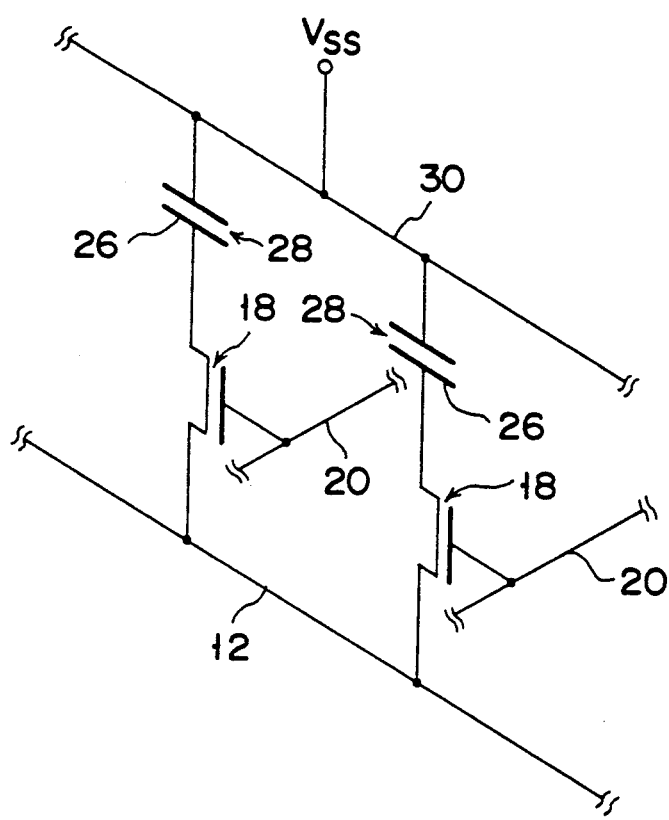
F I G. 4

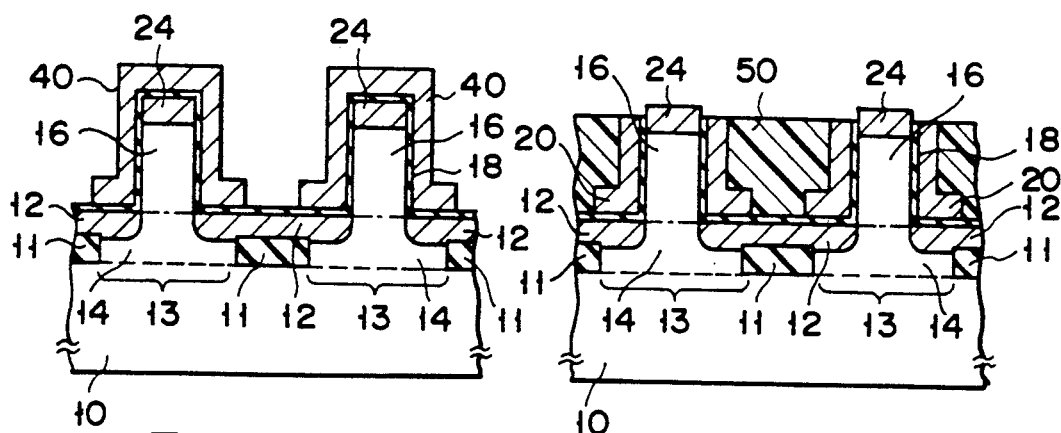
FIG. 5G
FIG. 5J
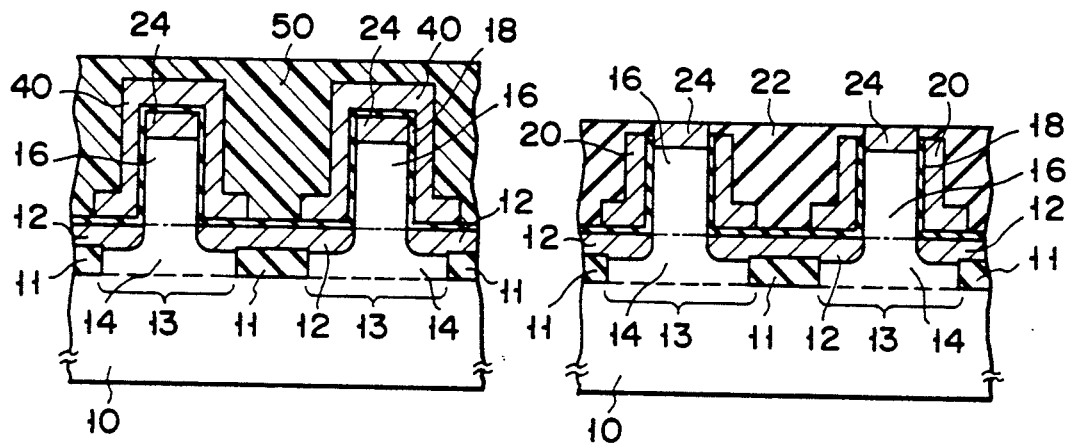
FIG. 5H
FIG. 5K
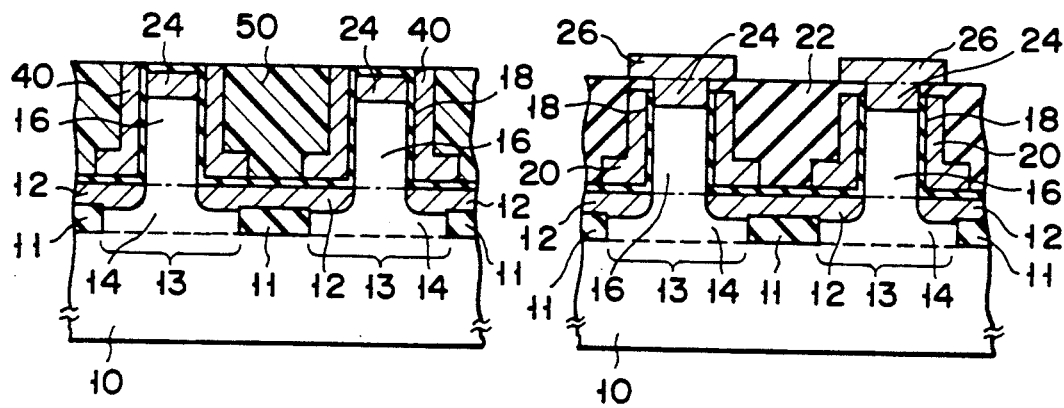
FIG. 5I
FIG. 5L

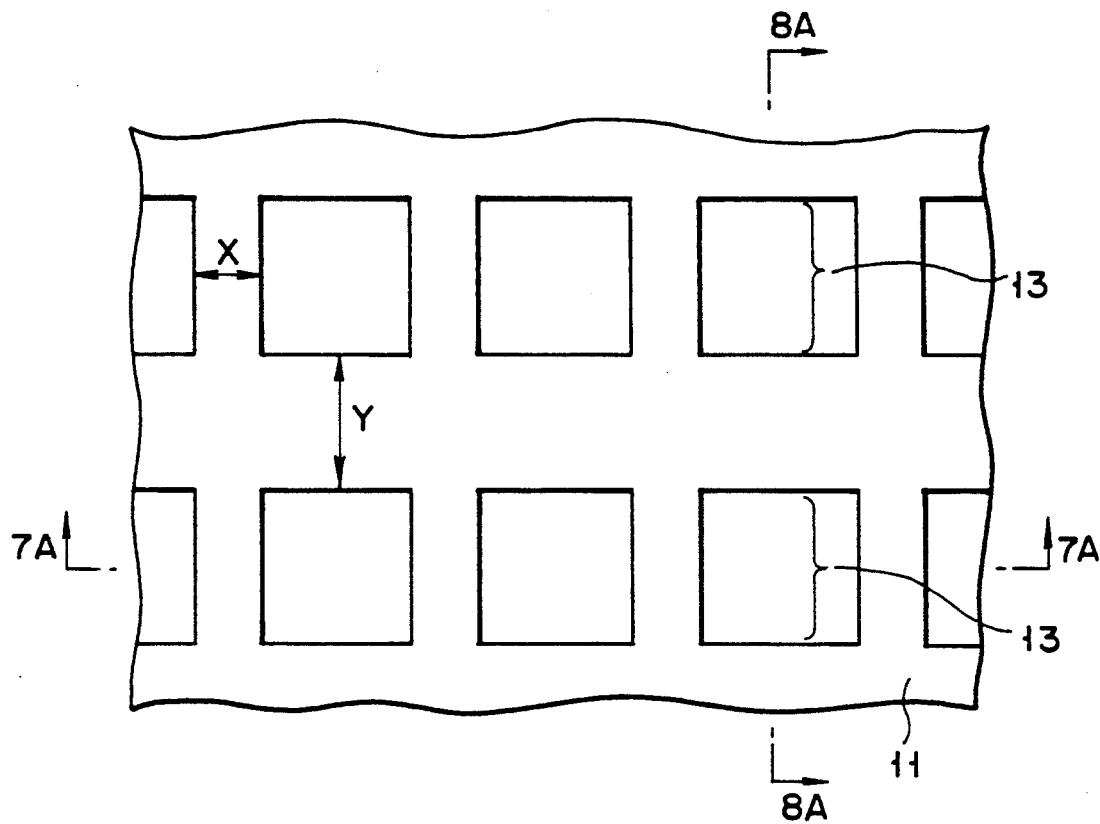
F I G. 6A
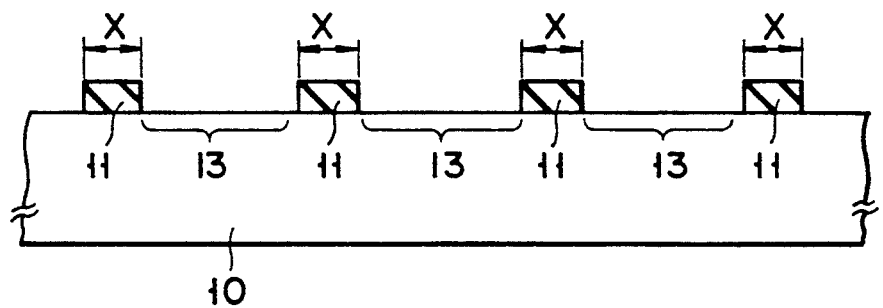
F I G. 7A

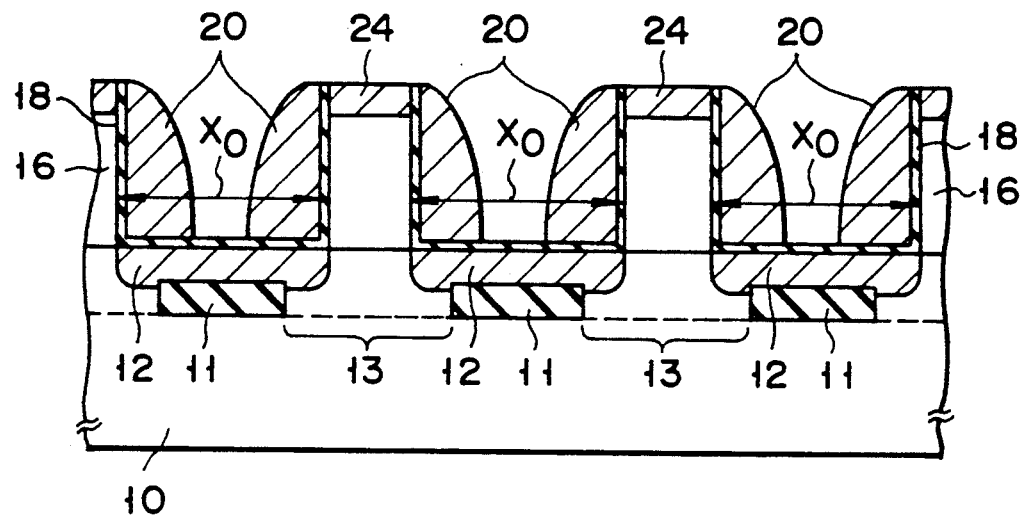
F I G. 10B
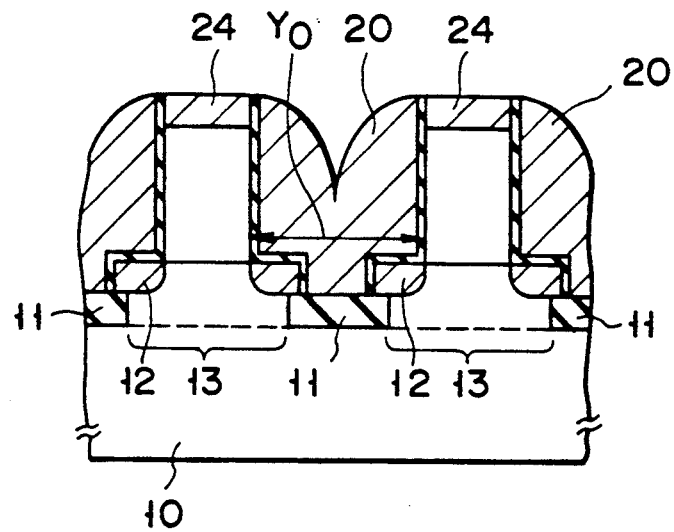
F I G. 11B

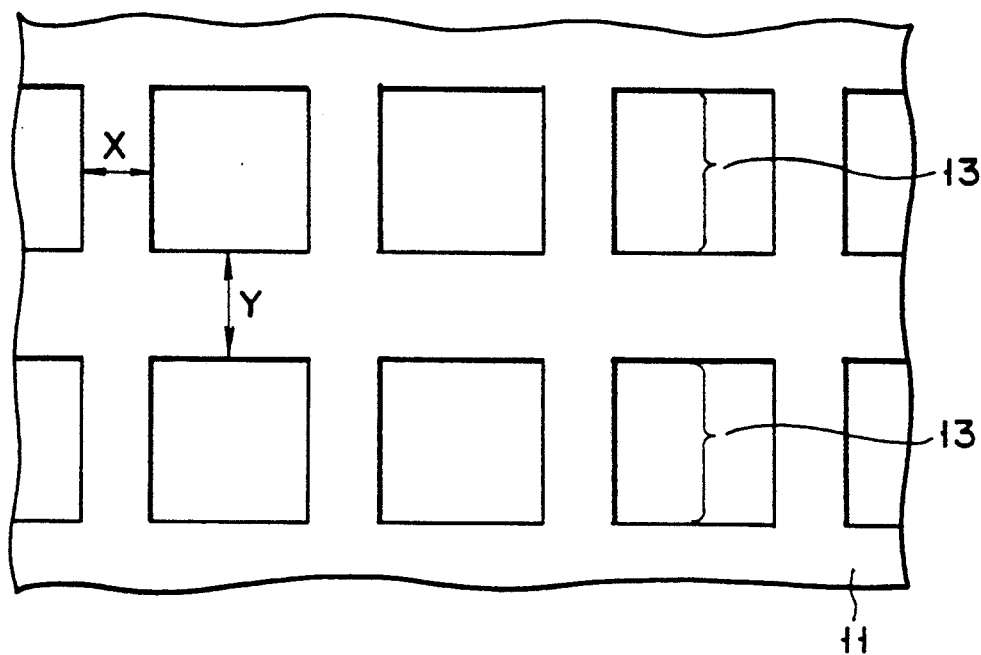
F I G. 12A
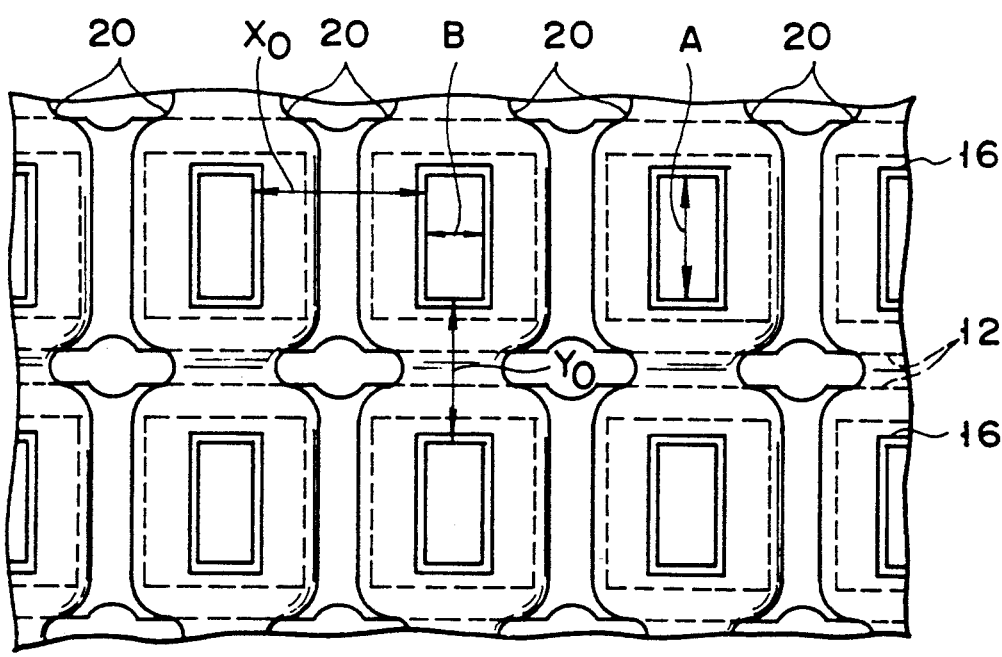
F I G. 12B

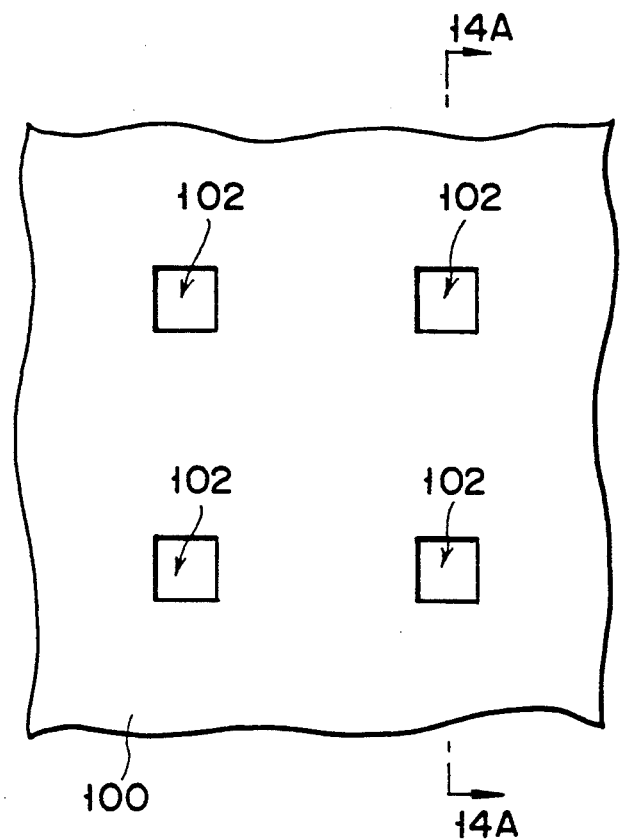
F I G. 13A
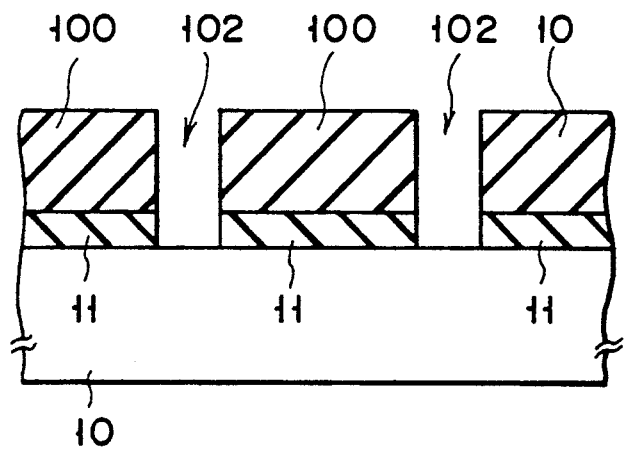
F I G. 14A

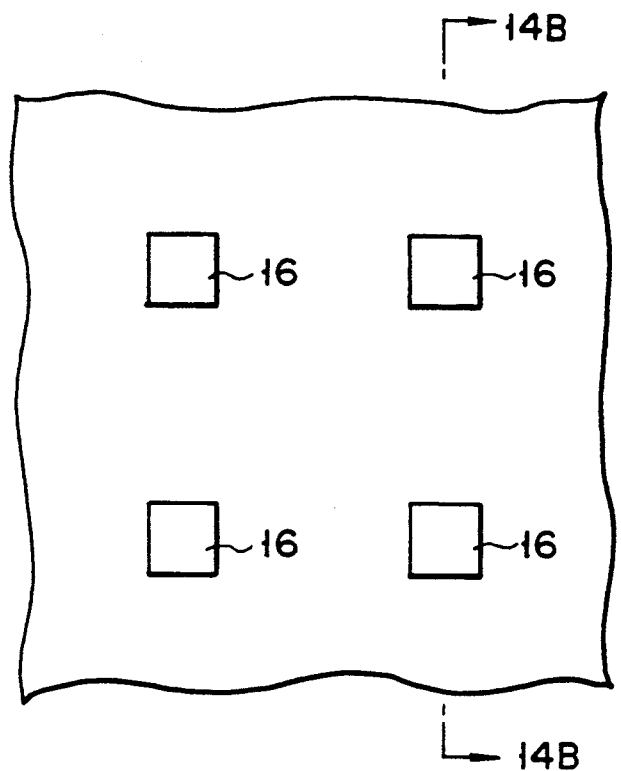
F I G. 13B
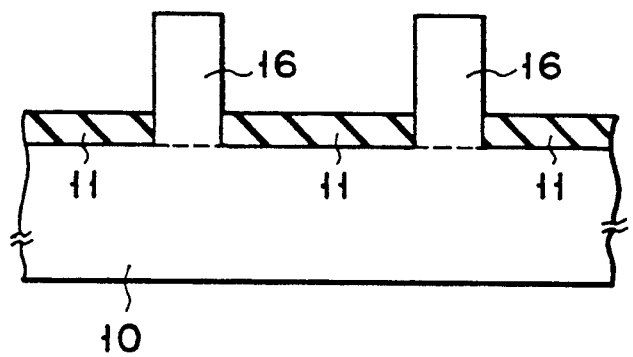
F I G. 14B

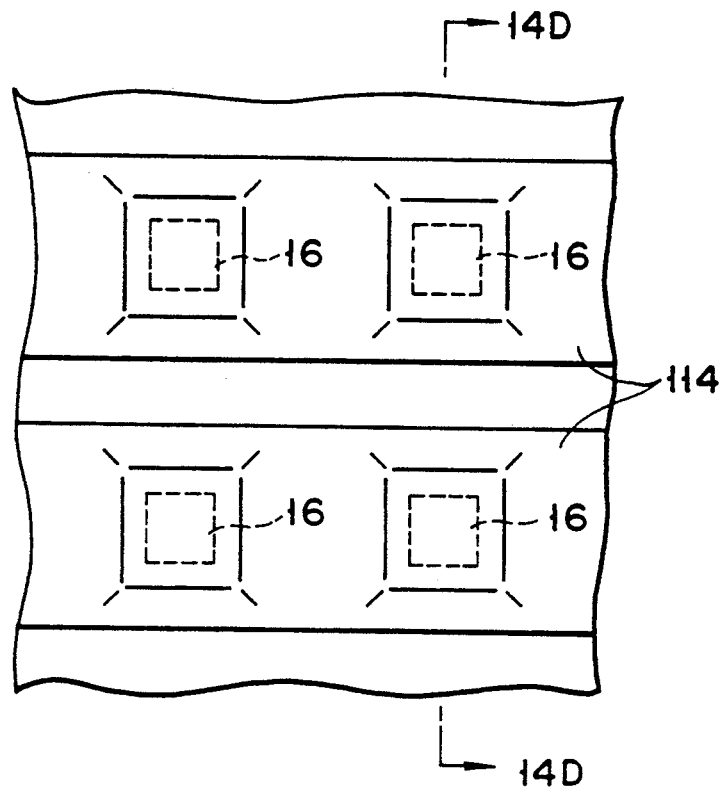
F I G. 13D
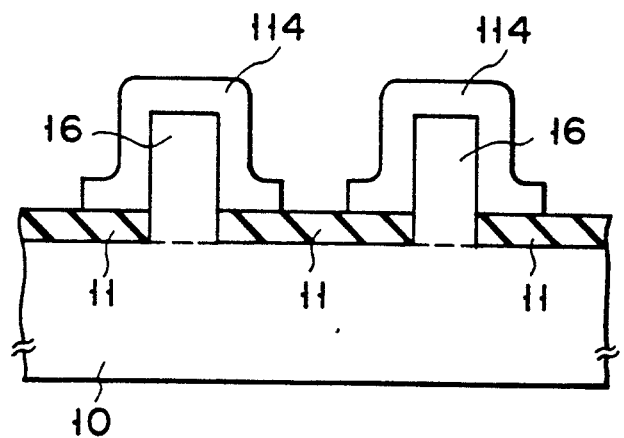
F I G. 14D

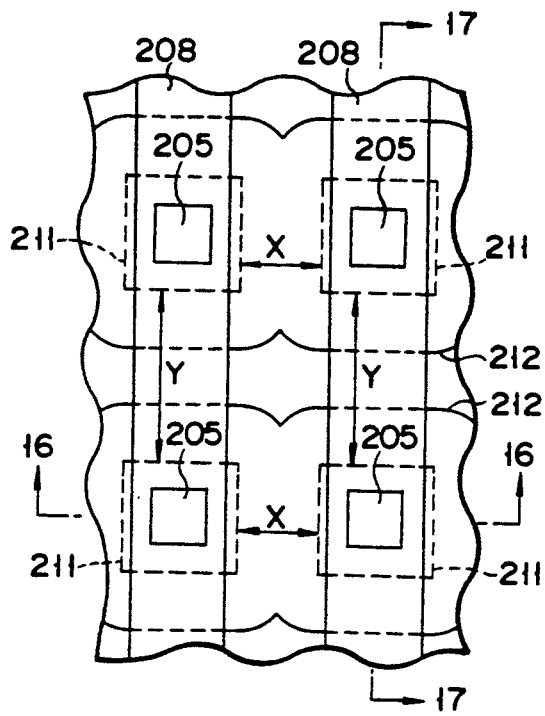
F I G. 15
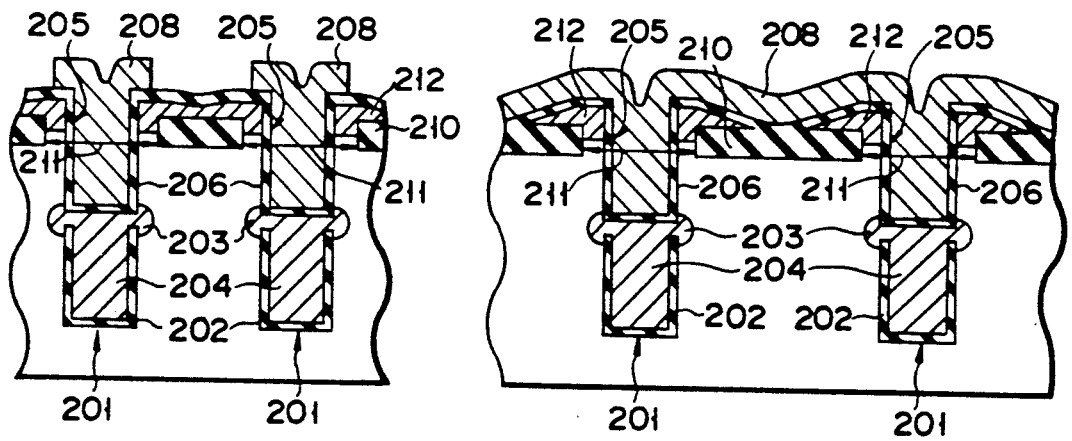
F I G. 16   F I G. 17

SEMICONDUCTOR MEMORY DEVICE HAVING A BIT LINE CONSTITUTED BY A SEMICONDUCTOR LAYER

This application is a continuation of application Ser. No. 07/687,698, filed Apr. 19, 1991, now abandoned.

BACKGROUND OF THE INVENTION

1. Field of the Invention

The present invention relates to a semiconductor memory device. More particularly, this invention pertains to a semiconductor memory device in which a bit line formed in a memory cell is constituted by a semiconductor layer.

2. Description of the Related Art

The following has been presented as a semiconductor memory device having memory cells with a bit line formed by a semiconductor layer:

A TRENCH TRANSISTOR CROSS-POINT DRAM CELL W. F. RICHARDSON ET AL. IEDM85. p714–p717.

The disclosed DRAM cell has a trench on a silicon substrate, with a storage node formed in the trench. A storage dielectric is formed between the storage node and the substrate. Part of the storage node is connected to the substrate. An insulating film is formed on the exposed face of the storage node to isolate the storage node from a word line. The word line, which is so formed as to come into the trench, serves as a gate to a channel in the substrate along the side wall of the trench. Further, an n+ type diffused bit line is formed in the direction normal to the plane containing the word line.

With the above structure, as each memory cell is formed at the cross point between the word line and bit line, it is easy to provide high integration of memory cells.

Because of the bit line formed by the n+ type diffusion layer, however, the following problems would arise:

(1) As the bit line is isolated from the substrate by a pn junction, the capacity of the bit line is large or the capacity of the pn junction is large. This results particularly in a reduction in the speed of an electrical signal traveling through the bit line, slowing the operational speed. Further, the large bit line capacity drops the potential of a minute electric signal flowing across the bit line. This conventional DRAM is not suitable for larger scale integration (16M, 64M, 256M, 1G, . . . ).

(2) Since the isolation of the bit line from the substrate is realized by the pn junction, there is a large junction leak current flowing from the bit line to the substrate. That is, the pn junction reverse current is large. Accordingly, the potential of a minute electric signal flowing across the bit line is likely to change, reducing the reliability, and the conventional DRAM is not suitable for larger scale integration which will surely be realized.

(3) Due to the isolation of the bit line from the substrate by the pn junction, this DRAM has a low resistiveness to a soft error. There is a high probability of α rays or the like entering particularly the bit line or a high probability of catching carriers ionized by α rays or the like, so that noise is likely to appear the bit line. In addition, the carriers entering the bit line may easily cause a malfunction (soft error), thus reducing the operational reliability.

SUMMARY OF THE INVENTION

It is therefore an object of the present invention to provide a DRAM cell which has a structure suitable for high integration, high reliability, and high speed operation, and can ensure large scale integration.

To achieve this object, a semiconductor memory device according to the present invention comprises:
- a semiconductor substrate of a first conductivity type having a main surface;
- an insulating film formed on the main surface;
- an opening formed in the insulating film to communicate with the substrate; and
- a bit line formed by a semiconductor layer of a second conductivity type formed on the insulating film and that portion of the substrate which is exposed through the opening.

The thus constituted DRAM cell is essentially of a cross-point type and is designed for easier high integration, as well as has the bit line isolated from the substrate by the insulating film. These features present the following effects.

(1) The capacity of the bit line will be reduced, thus enhancing the speed of an electrical signal traveling through the bit line and improving the potential of this electrical signal.

(2) The leak current flowing from the bit line to the substrate will decrease, reducing a potential change in a minute electrical signal running across the bit line.

(3) The probability of α rays or the like entering the bit line and the probability of ionized carriers being captured will be reduced, thus enhancing the resistiveness to a soft error.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a diagram of an equivalent circuit of the DRAM cells according to the first embodiment;

FIGS. 5A to 5L are cross sections of the step-by-step illustration of processes for fabricating the DRAM cell according to the first embodiment;

FIGS. 6A and 6B are pattern plan views the step-by-step illustration of the first modification of the fabricating method;

FIG. 7A is a cross section taken along the line 7A—7A in FIG. 6A;

FIG. 10B is a cross section taken along the line 10B—10B in FIG. 9B;

FIG. 11B is a cross section taken along the line 11B—11B in FIG. 9B;

FIGS. 12A and 12B are pattern plan views the step-by-step illustration of the third modification of the fabricating method;

FIGS. 13A to 13D are plan views the step-by-step illustration of the fourth modification of the fabricating method;

FIGS. 14A to 14D are cross sections respectively taken along the lines 14A—14A to 14D—14D in FIGS. 13A to 13D;

FIG. 15 is a schematic pattern plan view illustrating DRAM cells (four cells) according to the second embodiment of the present invention;

FIG. 16 is a cross section taken along the line 16—16 in FIG. 15;

FIG. 17 is a cross section taken along the line 17—17 in FIG. 15;

DETAILED DESCRIPTION OF THE PREFERRED EMBODIMENTS

Preferred embodiments of the present invention will now be described referring to the accompanying drawings.

First Embodiment

Figure 1:
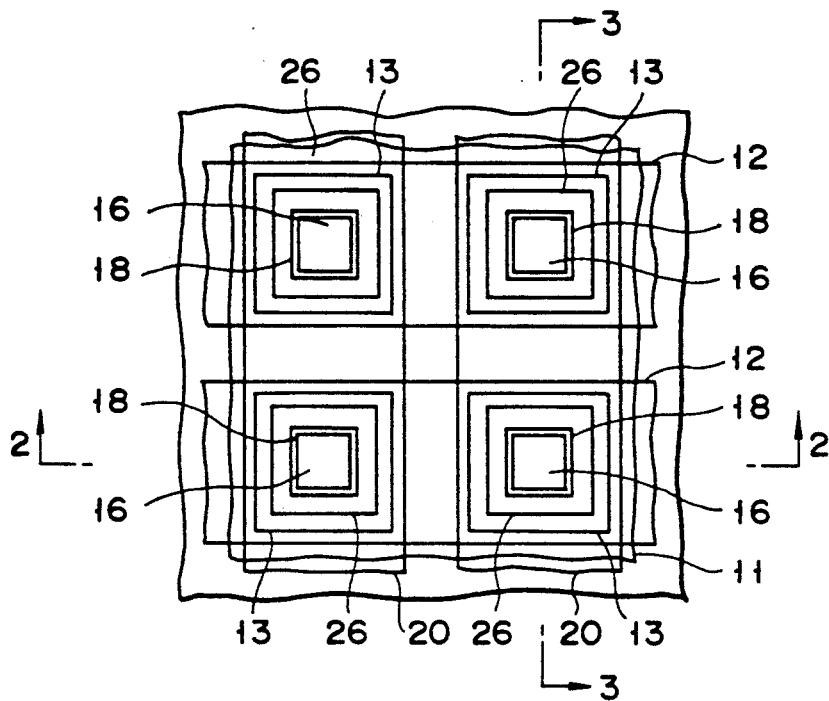
FIG. 1 is a schematic pattern plan view illustrating DRAM cells (four cells) according to the first embodiment of the present invention.
Figures 2, 3:
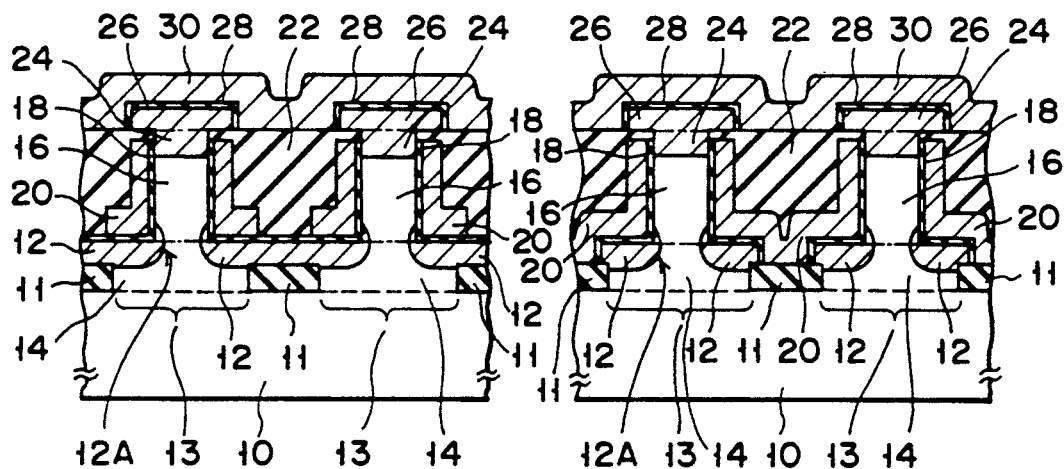
FIG. 2 is a cross section taken along the line 2—2 in FIG. 1.
FIG. 3 is a cross section taken along the line 3—3 in FIG. 1.

FIG. 1 is a schematic pattern plan view illustrating DRAM cells (four cells) according to the first embodiment of the present invention. FIG. 2 is a cross section taken along the line 2—2 in FIG. 1. FIG. 3 is a cross section taken along the line 3—3 in FIG. 1.

As shown in FIGS. 1 to 3, the DRAM cell embodying the present invention has the following structure.

A bit line is formed on, for example, a p type silicon substrate 10 through an insulating film 11 formed by, for example, a silicon oxide film. The bit line is constituted by an n type semiconductor layer 12 isolated in the bit-line forming direction. In some places of the insulating film 11 are formed openings 13 through which the p type substrate 10 is exposed. A p type silicon epitaxial layer 14 connected via the opening 13 to the p type substrate 10 is formed on the insulating film 11. The n type semiconductor layer 12 constituting the bit line is formed in this p type epitaxial layer 14. A p type silicon columnar region 16, which communicates with the p type substrate 10, is formed on that p type epitaxial layer 14 which corresponds to the opening 13. In the columnar region 16, an n type diffusion layer 12A is formed by an n type impurity diffused from the n type semiconductor layer 12. A gate insulating film 18 comprising, for example, a silicon oxide film or the like, is formed around the p type columnar region 16. On this gate insulating film 18 is formed an n type polysilicon layer 20 which constitutes a word line. The polysilicon layer 20 is formed, isolated in the direction normal to the plane containing the bit line. The word line 20 is isolated by an interlayer insulating film 22. This interlayer insulating film 22 also isolates the bit line (n type semiconductor layer 12) at some locations (not shown). An n type diffusion layer 24 is formed at the tip portion of the p type columnar region 16. An n type polysilicon layer 26 is formed on the n type diffusion layer 24, being exposed onto the interlayer insulating film 22. The n type diffusion layer 24 and n type polysilicon layer 26 are electrically connected together, constituting a storage node electrode of a capacitor. A dielectric film 28, which will be a dielectric of the capacitor, is formed on the n type polysilicon layer 26. Further, a cell plate electrode 30 comprising n type polysilicon, for example, is formed all over the dielectric film 28 and interlayer insulating film 22.

FIG. 4 illustrates an equivalent circuit of the DRAM cells having the above structure. The same reference numerals as used in FIGS. 1 to 3 are used in FIG. 4 to denote the identical portions to avoid their otherwise redundant description.

According to the thus constituted DRAM cell, a capacitor is formed at the cross point between the word line (n type polysilicon layer 20) and the bit line (n type semiconductor layer 12). Further, a switching transistor forms a channel along the side of the columnar region 16 and perpendicular to the substrate 10. The structure of the DRAM cell is therefore suitable for high integration. In addition, the cell plate electrode 30 is formed on the entire surface of the substrate 10, thus providing the largest capacitance from the planar point of view.

According to the memory cell embodying the present invention, the insulating film 11 is formed between the p type substrate 10 and the n type semiconductor layer 12 which constitutes the bit line. This structure can reduce the capacitance of the bit line and decrease the junction leak current from the bit line to the substrate. As around the n type semiconductor layer 12 or the bit line is surrounded by the insulating film 11 and interlayer insulating film 22, the probability of α rays or the like entering the bit line or the probability of catching the carriers ionized by the α rays or the like can be reduced.

Each of the bit lines if formed of an N-type silicon layer, and is insulated not by an P-N junction, but by an insulation layer. There are no P-N junctions through which a leakage current may flow. Hence, the bit lines can be arranged at relatively short intervals, thereby increasing the integration density of the memory-cell array.

The N-type silicon layer connected to the storage node of each memory cell is insulated by an insulation layer, too. There are formed no P-N junctions through which a leakage current may flow. This also helps to increase the integration density of the memory-cell array.

A method of fabricating a DRAM cell according to the first embodiment will be described below referring to FIGS. 5A to 5L. The same reference numerals as used in FIGS. 1 to 3 are used in FIGS. 5A–5L to specify the identical portions to avoid their redundant description.

Figure 5A:
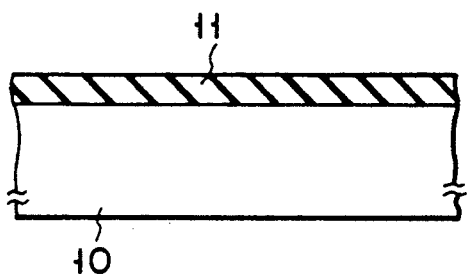

As shown in FIG. 5A, the thermal oxide film 11 is formed about 500 nm on the p type silicon substrate having, for example, a (100) face as the main surface by a LOCOS method, for example.

The thermal oxide film 11 is not restricted to this type, but may be a CVD silicon oxide film or a silicon nitride film deposited using a CVD method. Alternately, the thermal oxide film 11 may be a silicon oxide film deposited using an LPD method, or may be a composite film comprising the mentioned films.

Figure 5B:
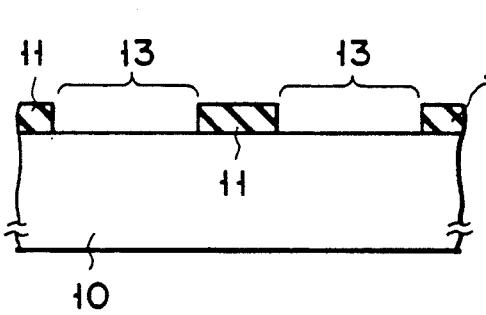

Then, the thermal oxide film 11 is selectively removed using, for example, an RIE method or anisotropic etching, as shown in FIG. 5B, thereby forming the openings 13 which reach the p type substrate 10.

Figure 5C:
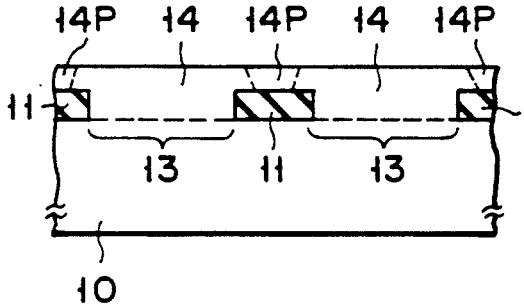

The p type silicon epitaxial layer 14 is then grown in the openings 13, as shown in FIG. 5C, using a selective epitaxial growth technique (hereinafter referred to as "SEG"). As a result, the opening 13 is buried with the epitaxial layer 14. Then, the p type epitaxial layer 14 is deposited on the thermal oxide film 11 using non-selective epitaxial etching. At this time, the polysilicon layer 14P grows on the thermal oxide film 11, while the single-crystal silicon layer 14 having grown on the opening 13 continues to do so.

In further growing epitaxial silicon on the insulating film 11 after the epitaxial silicon is buried in the opening 13, the wafer which will be the substrate may temporarily be taken out from a furnace for the epitaxial growth process. Alternately, with the wafer left in the furnace, the epitaxial growth may continue while changing the conditions for growing the epitaxial silicon.

Figure 19:
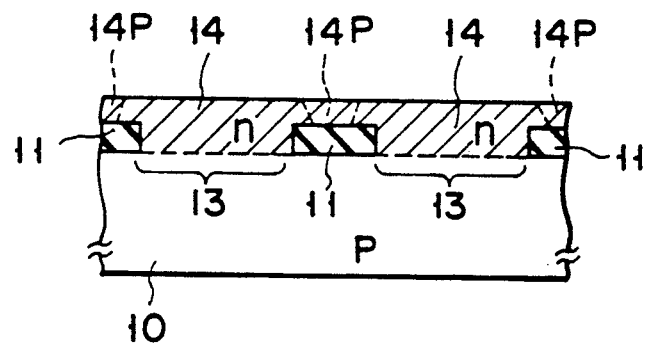
FIG. 19 is a cross section illustrating a case where an epitaxial layer in the process of FIG. 15C is of an n type.

Although the epitaxial layer 14 to be grown on the p type substrate 10 may be of an n type as shown in FIG. 19, it is desirable that the layer 14 have the same conductivity type (p type) as the substrate 10 as in this embodiment. This structure can permit a columnar region (which will be formed later) or the channel forming region of the switching transistor to be electrically connected via the p type epitaxial layer 14 to the p type substrate 10. Consequently, the substrate potential of the p type substrate 10 can be applied as a back gate bias to the channel forming region of the switching transistor.

To provide the above structure, the epitaxial growth of silicon is conducted while mixing boron under this epitaxial growth atmosphere. Alternately, boron ions, for example, may be injected after the epitaxial grown is completed, or the boron ions, for example, may selectively be injected in that portion which is to be made p type, such as a portion where the columnar region is to be formed later. The same will be applied to the subsequent epitaxial growing process.

It is more preferable that the polysilicon layer 14P grown on the thermal oxide film 11 has been made single crystal using, for example, a laser beam annealing technique.

Then, the p type epitaxial layer 14 is patterned to be a bit line by performing a photo-etching method where necessary (not shown).

Figure 5D:
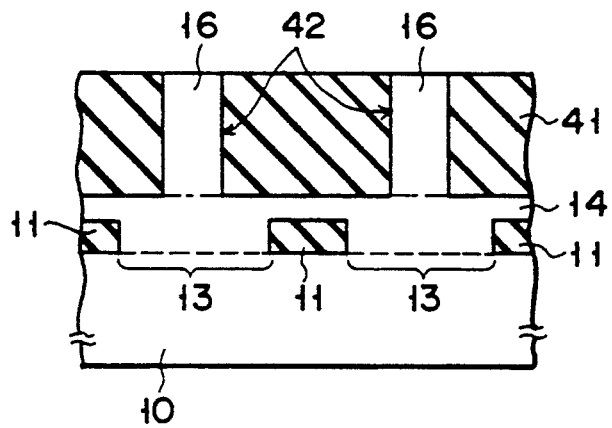

A silicon nitride film 41 is then deposited on the whole surface as shown in FIG. 5D, using a CVD method, for example. Then, an openings 42 are so formed using the photo-etching method as to reach the p type epitaxial layer 14 on the openings 13. Then, for example, p type silicon layers are selectively grown in the openings 42 using the SEG, thereby forming the p type columnar regions 16. The silicon nitride film 41 is not limited to this type, but it has only to be made of a material which has a large etching select ratio to the thermal oxide film 11 and can have high growth selectivity as well as high etching ratio to the growing material.

Figure 5E:
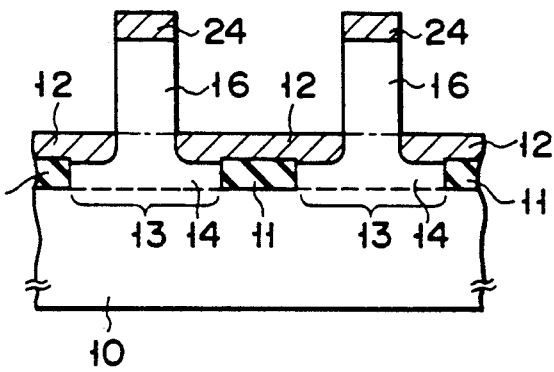

Then, as shown in FIG. 5E, the nitride film 41 is removed to expose the p type epitaxial layer 14 and p type columnar region 16. An n type impurity, for example, arsenic is ion-implanted in the exposed p type epitaxial layer 14 and the tip portion of the exposed p type columnar region 16. Then, the n type diffusion layer 12 constituting the bit line and the n type diffusion layer 24 constituting part of the storage node electrode are formed through thermal diffusion.

Figure 5F:
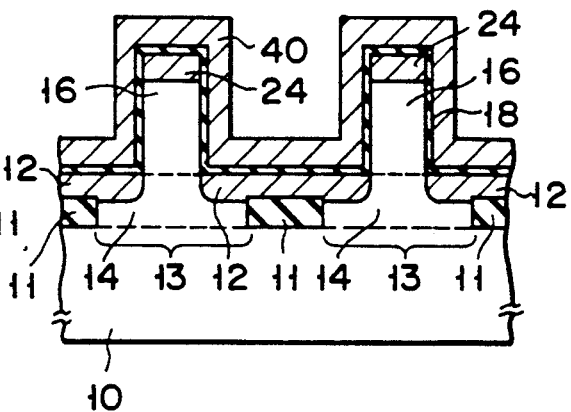

As shown in FIG. 5F, the gate insulating film 18 is then formed on the silicon surface exposed by the thermal oxidization. The conductive polysilicon layer 40 (either of n type or p type; the n type is desirable in view of the operational speed) is deposited on the resultant structure using the CVD method, for example.

As shown in FIG. 5G, the conductive polysilicon layer 40 is patterned into a word line pattern by the photo-etching method. This patterning is so conducted as to isolate the word line between the p type columnar regions 16.

After the photoresist (not shown) used in the step of FIG. 5G is removed, an organic film 50 comprising a resist, for example, is coated on the resultant structure, as shown in FIG. 5H.

Then, the organic film 50 and the conductive polysilicon layer 40 present at the tip portion of the p the columnar region 16 are etched back to expose the gate insulating film 18 by, for example, an RIE method or anisotropic etching, as shown in FIG. 5I.

Then, as shown in FIG. 5J, the gate insulating film 18 (e.g., silicon oxide film) and the conductive polysilicon layer 40 (20 in the diagram) are etched by, for example, a CDE method which is isotropic etching, thereby making the tip portion (around the n type diffusion layer 24) of the p type columnar region 16 protrude. The resultant structure can prevent the word line (conductive polysilicon layer) 20 from being short-circuited with the storage node electrode which will be formed later. The CDE method uses etching gas which can have a large etching select ratio of the silicon oxide film to silicon, for example, 1:10. Such etching gas may be of the Cl base ($CCl_4$ or the like) or Cl base+F base ($CCl_2F_2$ or the like).

Then, an interlayer insulating film 22 comprising a CVD silicon oxide film is deposited on the resultant structure, as shown in FIG. 5K using the CVD method, for example. The interlayer insulating film 22 is made flat and the n type diffusion layer 24 is exposed using the etch back technique which has been explained with reference to FIGS. 5H and 5I.

An n type polysilicon layer is then formed on the resultant structure, as shown in FIG. 5L, using the CVD method, for example. Then, the n type polysilicon layer is patterned using the photo-etching method, thus forming the n type polysilicon layer 26 on the n type diffusion layer 24; the layer 26 will become part of the storage node electrode.

The n type polysilicon layer 26 is not limited to this type. For instance, with the n type diffusion layer 24 as a seed crystal, an n type epitaxial layer may be grown thereon to form the polysilicon layer 26. This method can permit the n type epitaxial layer corresponding to the n type polysilicon layer 26 to be self-aligned with the n type diffusion layer 24. Further, if the epitaxial growth is limited only to around the n type diffusion layer 24 and is controlled not to contact the other growth regions, the patterning of the n type polysilicon layer to provide the storage node electrode may be omitted.

The n type polysilicon layer 26 may be made of a high-melting point metal, such as tungsten or titanium, besides epitaxial silicon, or an alloy of such a high-melting point metal and silicon, namely, high-melting point metal silicide.

Then, as shown in FIGS. 1 to 3, the dielectric film 26 of the capacitor, which comprises a silicon oxide film formed by, for example, thermal oxidization, is formed on the surface of the n type polysilicon layer 26.

The dielectric film 26 may be such a single-layered film as silicon nitride film, tantalum oxide film, yttrium oxide film or hafnium oxide film beside silicon oxide film, or a laminated film comprising these films.

Then, the cell plate electrode 30 comprising an n type polysilicon layer is formed using, for example, the CVD method. the cell plate electrode 30 may be made of a high-melting point metal, such as tungsten or titanium, besides epitaxial silicon, or an alloy of such a high-melting point metal and silicon (namely, high-melting point metal silicide) or aluminum or the like.

Through the above processes, the DRAM cell according to the present invention is completed.

Another method of fabricating a DRAM cell according to the first embodiment will now be described.

Figure 8A:
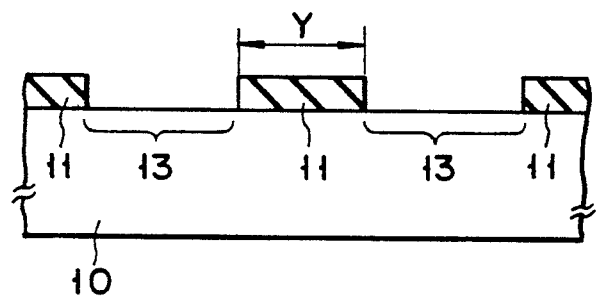
FIG. 8A is a cross section taken along the line 8A—8A in FIG. 6A.
Figure 6B:
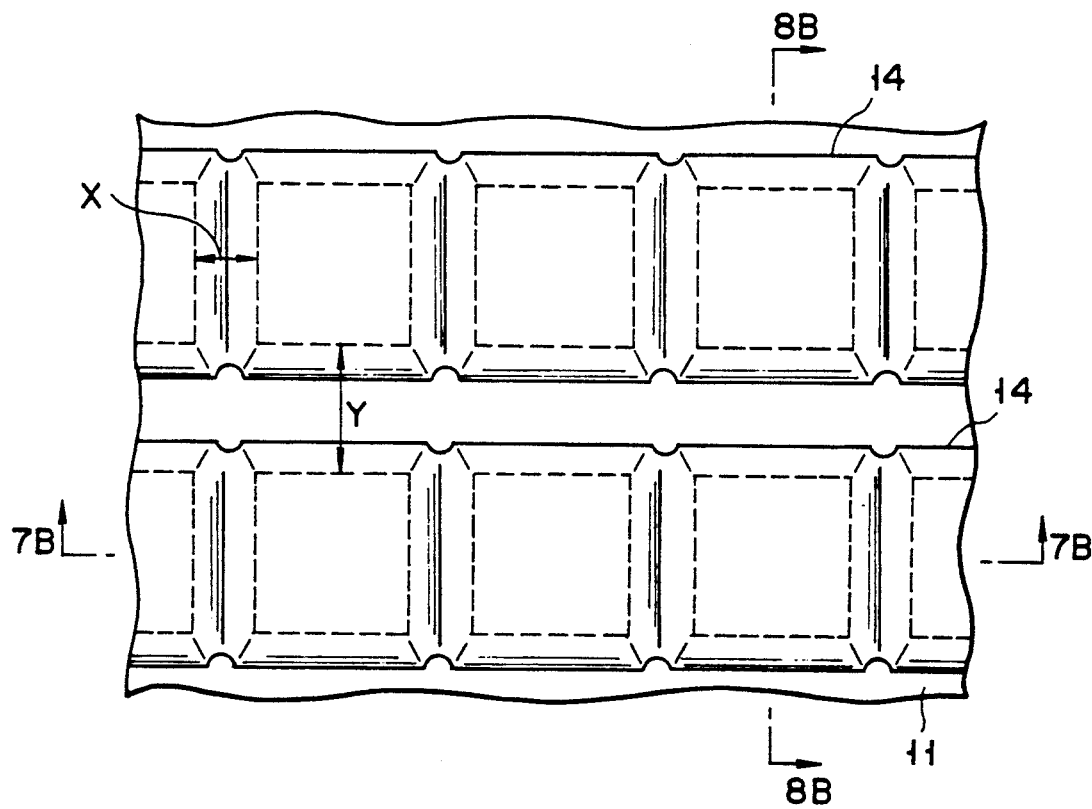
Figure 7B:
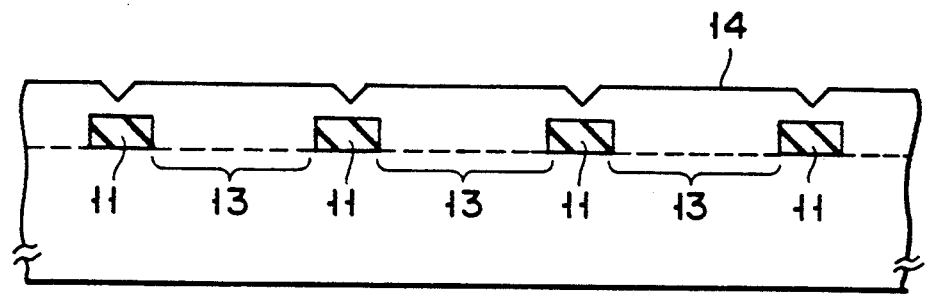
FIG. 7B is a cross section taken along the line 7B—7B in FIG. 6B.
Figure 8B:
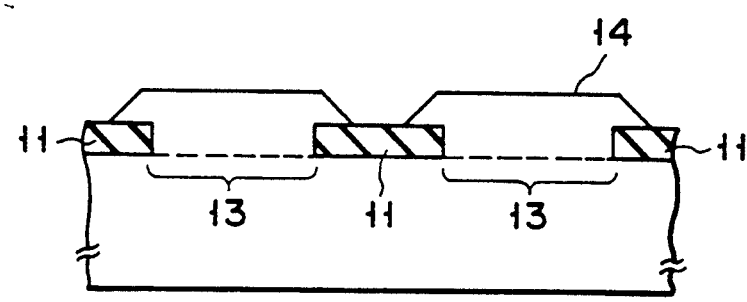
FIG. 8B is a cross section taken along the line 8B—8B in FIG. 6B.

FIGS. 6A and 6B are pattern plan views the step-by-step illustration of the first modification of the fabricating method. FIG. 7A is a cross section taken along the line 7A—7A in FIG. 6A, and FIG. 7B is a cross section taken along the line 7B—7B in FIG. 6B. FIG. 8A is a cross section taken along the line 8A—8A in FIG. 6A, and FIG. 8B is a cross section taken along the line 8B—8B in FIG. 6B. The same reference numerals as used in FIGS. 1 to 3 are used in these diagrams to denote the identical portions to avoid their otherwise redundant description.

After the process shown in FIG. 5A, the openings 13 as shown in FIGS. 6A, 7A and 8A are formed. At this time, the relation between the gap between these openings 13 in the bit-line forming direction X and the gap in the word-line forming direction Y is set to be $X < Y.$ With this particular setting, the SEG is to be conducted.

If the epitaxial layers 14 are grown as shown in FIGS. 6B, 7B and 8B, these layers 14 are connected together in the gap X, while the layers 14 are not connected in the gap Y. This is because the gap Y is greater than the gap X. Accordingly, the epitaxial layers 14 are so formed to be continuous in the bit-line forming direction and be discontinuous in the word-line forming direction. It is therefore possible to omit the bit-line patterning as described with reference to FIG. 5C, and form the bit line self-aligned with the opening 13.

The DRAM cell has only to be fabricated thereafter by the method explained with reference to FIGS. 5D to 5L.

Figure 9A:
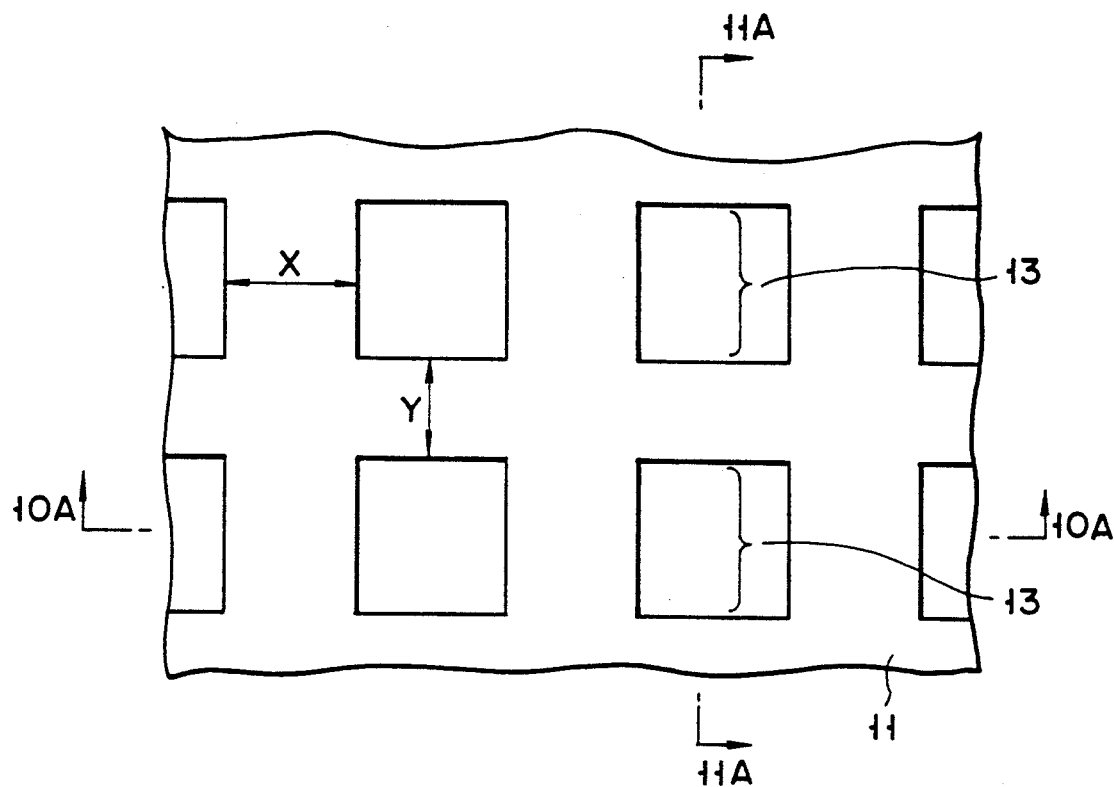
FIGS. 9A and 9B are pattern plan views the step-by-step illustration of the second modification of the fabricating method.
Figure 10A:
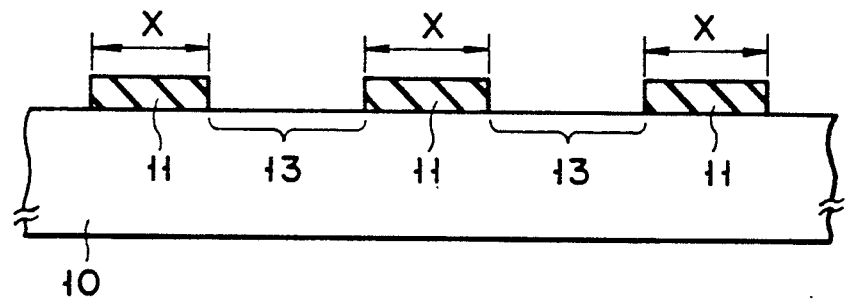
FIG. 10A is a cross section taken along the line 10A—10A in FIG. 9A.
Figure 11A:
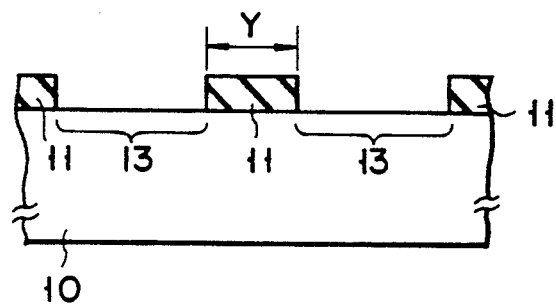
FIG. 11A is a cross section taken along the line 11A—11A in FIG. 9A.
Figure 9B:
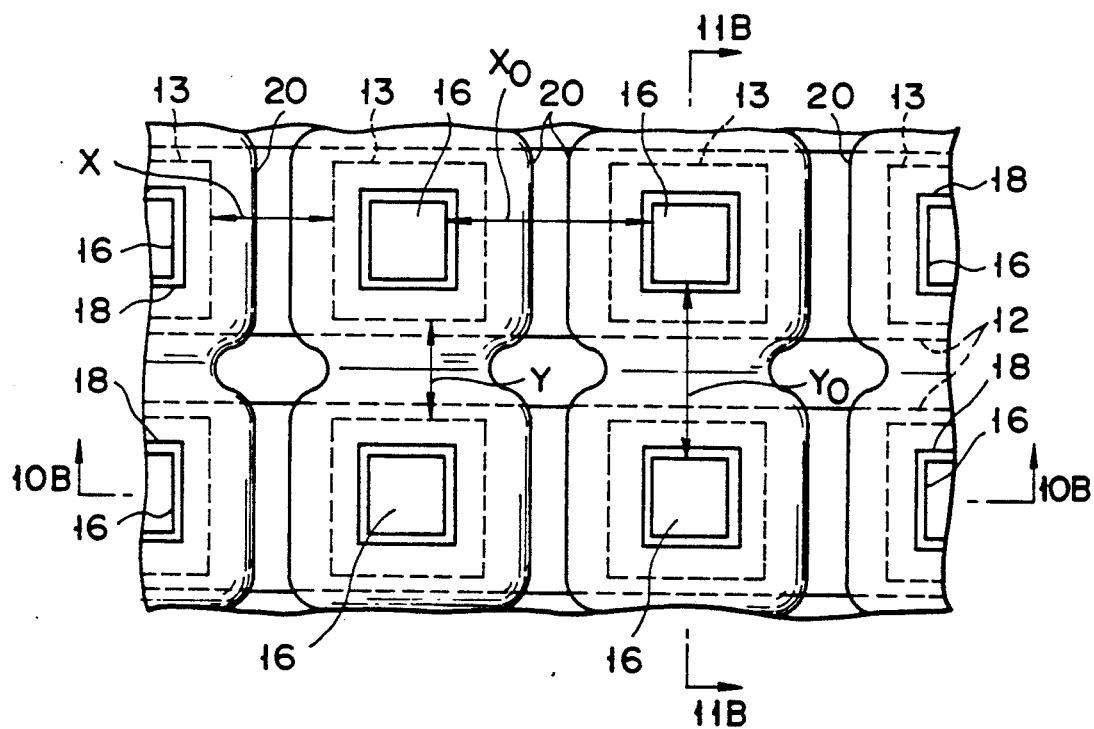

FIGS. 9A and 9B are pattern plan views the step-by-step illustration of the second modification of the fabricating method. FIG. 10A is a cross section taken along the line 10A—10A in FIG. 9A, and FIG. 10B is a cross section taken along the line 10B—10B in FIG. 9B. FIG. 11A is a cross section taken along the line 11A—11A in FIG. 9A, and FIG. 11B is a cross section taken along the line 11B—11B in FIG. 9B. The same reference numerals as used in FIGS. 1 to 3 are used in these diagrams to denote the identical portions to avoid their otherwise redundant description.

After the process shown in FIG. 5A, the openings 13 as shown in FIGS. 9A, 10A and 11A are formed. At this time, the relation between the gap between these openings 13 in the bit-line forming direction X and the gap in the word-line forming direction Y is set to be $X > Y$ which is reverse to the relation of the first modification. With this particular setting, the epitaxial layer 14 is grown by the method which has already been explained with reference to FIG. 5C, then the layer 14 is patterned to form the bit line 12. Then, the columnar region 16 is formed by the method described with reference to FIG. 5D, followed by the formation of the n type diffusion layers 12 and 24 by the method explained with reference to FIG. 5E.

Then, the polysilicon layer 20 to be the word line is deposited as shown in FIGS. 9B, 10B and 11B. When the polysilicon layers 20 are etched using, for example, the RIE method, these layers 20 are isolated from each other in the gap X, while the layers 20 are connected together in the gap Y. In other words, the polysilicon layers 20 are so formed to be continuous in advance in the word-line forming direction and be discontinuous in the bit-line forming direction. It is therefore possible to omit the word-line patterning as described with reference to FIG. 5G, and form the word line (polysilicon layer 20) self-aligned with the columnar region 16.

The DRAM cell has only to be fabricated thereafter by the method explained with reference to FIGS. 5H to 5L.

The patterning of the word line may be omitted by controlling the gap between the columnar regions 16 as well as controlling the gaps X and Y between the openings 13. That is, with $X_0$ denoting the gap between the columnar regions 16 in the bit-line forming direction and $Y_0$ being the gap in the word-line forming direction, the relation between these gaps is set as $X_0 > Y_0.$ When anisotropic etching is conducted under this condition, the polysilicon layers are isolated from each other in the gap $X_0$ while they are connected in the gap $Y_0$. Therefore, the polysilicon layers 20 are so formed to be continuous in the word-line forming direction and be discontinuous in the bit-line forming direction.

FIGS. 12A and 12B are pattern plan views the step-by-step illustration of the third modification of the fabricating method. The same reference numerals as used in FIGS. 1 to 3 are used in these diagrams to denote the identical portions to avoid their otherwise redundant description.

After the process shown in FIG. 5A, the openings 13 as shown in FIGS. 5A, 6A and 7A are formed. At this time, the gap X between these openings 13 in the bit-line forming direction is set to the value used in the first modification of the fabricating method and the gap Y in the word-line forming direction is set to the value used in the second modification of the fabricating method. Wit this setting, therefore, it is possible to omit the bit-line patterning and word-line patterning, and form the bit line self-aligned with the openings 13 as well as form the word line self-aligned with the columnar region 16, as shown in FIG. 5E.

According to the third modification of the fabricating method, it is desirable to control the arrangement and planar shape of the columnar regions 16.

For instance, the method of forming the bit line 12 without patterning is affected by the gap arrangement of the openings 13 as described in the section of the first modification.

The method of forming the word line 20 without patterning is affected by the gap arrangement of the columnar regions 16 as well as the gap arrangement of the openings 13 as explained in the section of the second modification.

Now in addition to the control of the gaps of the columnar regions 16 or the control of the gap $X_0$ in the bit-line forming direction and the gap $Y_0$ in the word-line forming direction, the planar shape of the columnar regions 16 is to be controlled. For instance, the planar shape of the columnar regions 16 is so set as to realize the relation $$A > B$$

where A is the length of the columnar regions 16 in the word-line forming direction and B is the length in the bit-line forming direction. Setting this length relation can control the gap $X_0$ in the bit-line forming direction and the gap $Y_0$ in the word-line forming direction.

Although this control of the planar shape of the columnar regions 16 can also be applied to the second modification of the fabricating method, it is desirable to use such control particularly in the third modification which forms both the word line and bit line without any patterning.

The DRAM cell has only to be fabricated thereafter by the method explained with reference to FIGS. 5H to 5L.

FIGS. 13A to 13D are pattern plan views the step-by-step illustration of the fourth modification of the fabricating method. FIGS. 14A through 14D are cross sections respectively taken along the lines 14A—14A to 14D—14D in FIGS. 13A to 13D. The same reference numerals as used in FIGS. 1 to 3 are used in these diagrams to specify the identical portions to avoid their otherwise redundant description.

After the process shown in FIG. 5A, an insulating film 100 comprising a silicon nitride film is deposited on the entire surface of the resultant structure as shown in FIGS. 13A and 14A using, for example, the CVD method. Then, openings 102 are formed by the photo-etching method, penetrating the silicon nitride film 100 and the insulating film 11 comprising a silicon oxide film and reaching the p type silicon substrate 10.

The insulating film 100 is not limited to a silicon nitride film, but it has only to be made of a material which has a large etching select ratio to the insulating film 11 (silicon oxide film in this embodiment) and has high growth ratio of the substrate 10 to silicon.

Then, epitaxial silicon is selectively grown in the opening 102 by the SEG, for example, as shown in FIGS. 13B and 14B.

It is desirable that the epitaxial silicon to be selectively grown have the same conductivity type as the substrate 10.

The insulating film 100 is then removed.

Figure 13C:
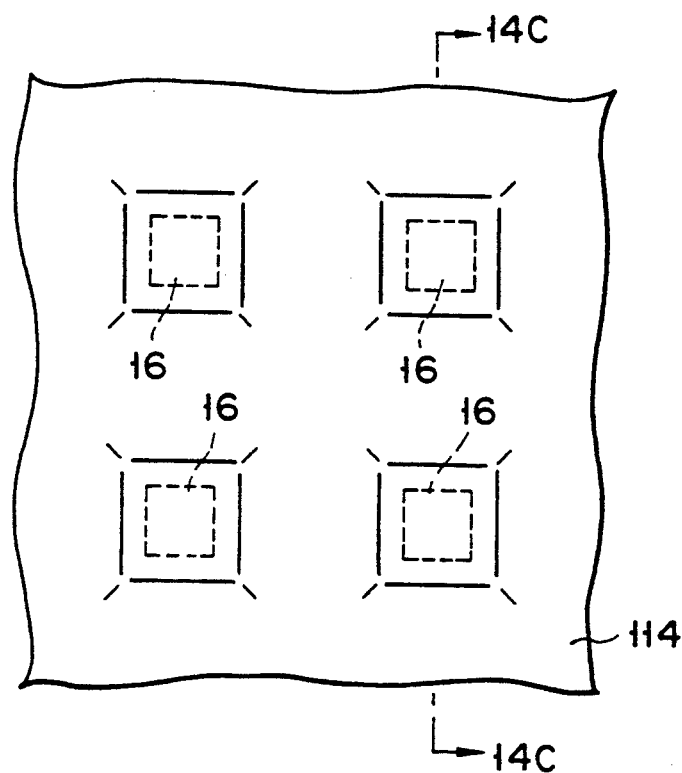
Figure 14C:
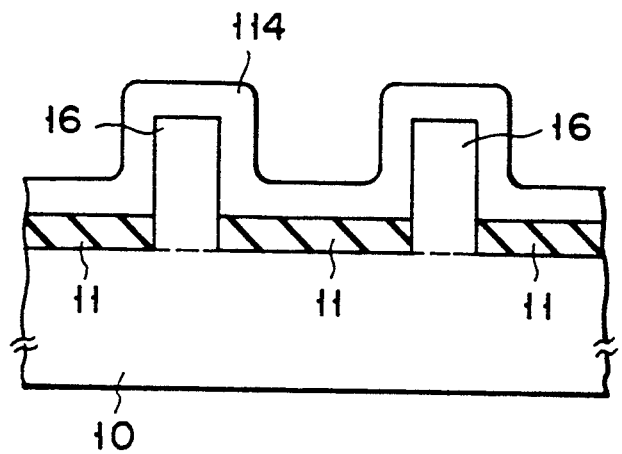

Then, as shown in FIGS. 13C and 14C, an epitaxial silicon layer 114 is selectively formed on the resultant structure.

The epitaxial silicon layer 114 is then patterned to yield the bit line pattern as shown in FIGS. 13D and 14D.

The silicon layer which constitutes the bit line may be formed after forming the columnar region 16 as described above.

The DRAM cell has only to be fabricated thereafter by the method explained with reference to FIGS. 5E to 5L.

Second Embodiment

FIG. 15 is a schematic pattern plan view illustrating DRAM cells (four cells) according to the second embodiment of the present invention. FIG. 16 is a cross section taken along the line 16—16 in FIG. 15, and FIG. 17 is a cross section taken along the line 17—17 in FIG. 15.

As shown in FIGS. 15 to 17, a trenches 201 is formed in a silicon substrate 200 of, for example, p type. A dielectric films 202 of a capacitors are formed on the side wall of the trenches 201. An openings 203 are selectively formed in the dielectric films 202 to expose the substrate 200. In the trenches 200 are formed an n type semiconductor layers 204 which will serve as a storage node electrode. In this case, the p type substrate 200 also serves as a cell plate electrode. The n type semiconductor layers 204 are exposed through the openings 203 to the substrate 200. An openings 205 are provided in the p type substrate 200 in association with the n type semiconductor layers 204. An insulating films 206 constituting a gate insulating films are formed in the openings 205 to electrically isolate a word lines 208 formed in the openings 205 from the n type semiconductor layers 204 and other conductive regions. On the p type substrate 200 is formed an insulating film 210, which comprises a silicon oxide film, for example, and has an openings 211 formed around the openings 205. Bit lines 212 formed by, for example, an n type diffusion layer (silicon) is formed on the insulating film 210.

Each of the bit lines is formed on an N-type silicon layer. The N-type layer is formed by means of epitaxial growth, by using the insulation film formed on the substrate and having openings. These openings are spaced part from one another by distance X in the X direction and by distance Y in the Y direction. The distance X is shorter than the distance Y. Hence, as the epitaxial growth proceeds, the N-type silicon layers join together, forming a strip of layer extending in the X direction. This strip is used as a bit line. Thus, bit lines extending in the X direction can be formed; an N-type silicon layer need not be patterned into a plurality of bit lines.

According to the thus constituted DRAM cell, the switching transistor forms a channel nearly normal to the substrate 200, and the substrate 200 serves as cell plate electrode. The structure of the DRAM cell is therefore suitable for high integration. Further, the bit line 212 formed by an n type diffusion layer is isolated from the p type substrate 200 by the insulating film 210, thereby overcoming the problems of the operational speed, and the leak current from the bit line 212 to the substrate 200 as well as the problem concerning a soft error as per the first embodiment.

Figure 18:
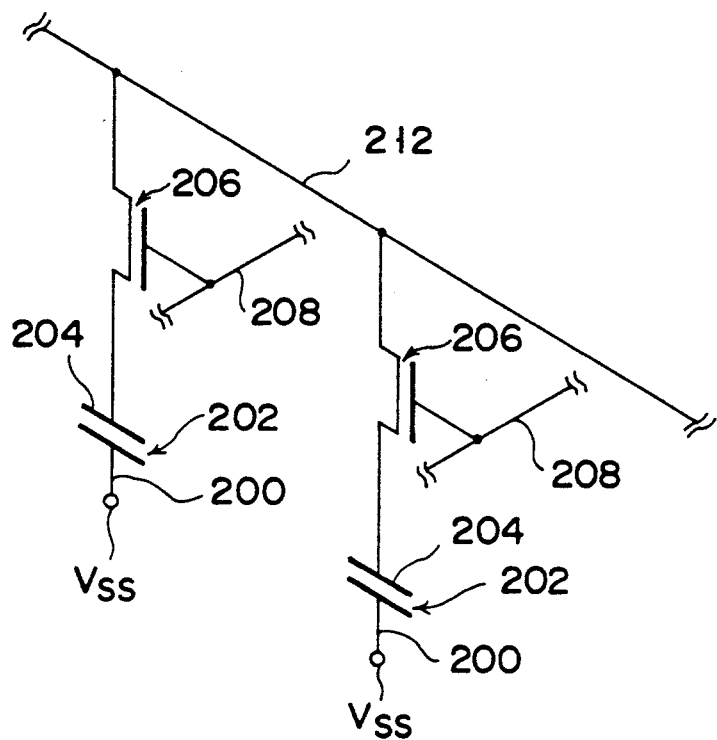
FIG. 18 is a diagram of an equivalent circuit of the DRAM cell according to the second embodiment.

FIG. 18 illustrates an equivalent circuit of the DRAM cell according to the second embodiment. The same reference numerals as used in FIGS. 1 to 3 are used in this diagram to specify the identical portions to avoid their otherwise redundant description.

The effects of the DRAM cells according to the first and second embodiments will be explained below referring to specific values.

When the isolation between the bit line formed by a diffusion layer and substrate as in the conventional cell is pn junction, with impurity density of the substrate: about $1 \times 10^{17}$ cm$^{-3}$
impurity density of the bit line: about $1 \times 1020$ cm$^{-3}$ then the capacitance of the pn junction is about 0.4 (fF/$\mu$ m$^2$) per unit area (f: "femto" which is the prefix to indicate $10^{-15}$).

This capacitance is equivalent to the film thickness of 86.3 nm of the capacitor insulating film (assumed to be SiO$_2$) in terms of the MOS capacitance. If the thickness of the insulating film is 86.3 nm or greater, for example, 500 nm mentioned above, it is understood that the bit line capacitance significantly decreases. Accordingly, the speed of an electrical signal running through the bit line is improved.

It is also known that the signal potential read on the bit line is proportional to $C_S/C_B$ where $C_S$ is the memory cell capacitance and $C_B$ is the bit line capacitance. According to the cell of present invention, particularly $C_B$ can be made smaller, increasing the signal potential and stabilizing the circuit operation as a consequence. Further, even if $C_S$ is made smaller than the conventional one, it is possible to acquire a sufficiently large signal potential. The allowance for smaller $C_S$ means that the load in the fabricating processes can be reduced. For instance, various propositions have been made so far to sufficiently increase the signal potential, paying great attention to increasing $C_S$. This requires that the dielectric film of the cell capacitor be made thinner, a ferroelectric film be used or these films be laminated, resulting in a very large load in the fabricating processes. In other words, the formation of such a ferroelectric film increases the number of steps required for the cell fabrication, or is difficult to achieve due to the today's insufficient state-of-the-art.

According to the present invention, however, the DRAM cell is designed also in light of reduction in $C_B$, so that a sufficiently large signal potential can be obtained even by the present state-of-the-art, e.g., forming the dielectric film of a single-crystal silicon oxide film having a thickness of about 10 nm. In addition, the art of forming such a dielectric film is now fully established, realizing high yield in the fabrication of the DRAM cells.

Of course, the mentioned measure of making the dielectric film thinner, using a ferroelectric film or lamination of these films can also be applied to the fabrication of the DRAM cells according to the present invention without causing any problem. Such a measure, if applied to this invention, can realize the demand of higher integration.

Further, the conventional memory cell has a problem of a large leak current from the bit line to the substrate. This current is called a pn junction reverse current which is originated from crystal defect caused in the substrate where a depletion layer is to be formed. The crystal defect will surely occur due to variation in the fabricating processes or the like. The generation of the leak current reduces the potential of the signal to be read out.

Since, according to.the semiconductor memory device embodying the present invention, the bit line is isolated as much as possible from the substrate by the insulating film, so that the pn junction between the bit line and substrate can be limited only to the vicinity of the region where the source or drain of the switching transistor is formed, thus reducing the leak current.

The conventional memory cell also has a problem of generating a soft error.

The soft error will originate from the wiring layer made of aluminum or the like in the memory device, or $\alpha$ rays or the like, generating and emanated from the package containing the device, hitting the pn junction, when cell data is read out from the bit line. The $\alpha$ rays travel through the silicon substrate while generating pairs of electrons and holes. In particular, the generated electrons enter the bit line along the diffusion or the locus of the $\alpha$ rays, changing (lowering) the potential of the bit line. When the amount of reduction is greater than the signal potential to be read out, a so-called erroneous reading (soft error) would occur. The larger the pn junction area between the bit line and substrate, the higher the probability of occurrence of the soft error.

According to the memory cell of the present invention, however, the pn junction between the bit line and the substrate is avoided as much as possible, thus dropping the probability of causing the soft error. In other words, the insulating film formed between the bit line and substrate becomes a barrier to shield the electrons generated by incident $\alpha$ rays.

The effects originating from modification of the fabricating method will now be discussed.

The effect on the structure of the memory cell according to the first modification is such that the bit line is formed in self-alignment with the opening formed in the insulating film which isolates the bit line from the substrate, realizing a finer bit line pattern.

The effect on the fabricating method is to be able to omit a step of patterning the bit line to thereby suppress an increase in the number of required steps.

The effect on the structure of the memory cell according to the second modification is such that the word line is formed in self-alignment with the columnar region formed on the aforementioned opening, realizing a finer word line pattern.

The effect on the fabricating method is to be able to omit a step of patterning the word line to thereby suppress an increase in the number of required steps.

The effect on the structure of the memory cell according to the third modification is the combination of the effects obtained by the first and second modifications.

The effect on the fabricating method is to be able to omit a step of patterning the bit line to thereby suppress an increase in the number of required steps.

The effect on the structure of the memory cell according to the fourth modification is such that the columnar region which should communicate with the substrate is formed in self-alignment with the aforementioned opening formed in the insulating film, so that the columnar region is suitable to realize higher integration of DRAM cells. In this case, the memory cells will have the smallest pn junction area between the bit line and substrate.

The effect of the fourth modification on the fabricating method is such that the patterning of a mask (insulating film) to form the columnar region and the patterning of the opening in the insulating film, which reaches the substrate, can be done in a single step, thus suppressing an increase in the number of required steps.

The present invention is not restricted to the above-described embodiments, but may be modified in various manners without departing from the scope and spirit of the invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate of a first conductivity type having a main surface;
    an insulating film formed on said main surface;
    an opening formed in said insulating film to communicate with said substrate;
    a bit line formed by a semiconductor layer of a second conductivity type formed on said insulating film and that portion of said substrate which is exposed through said opening;
    a region of said first conductivity type formed in that portion of said semiconductor layer of said second conductivity type constituting said bit line which is in said opening, and communicating with said substrate;
    a columnar region formed on said region of said first conductivity type and made of semiconductor of said first conductivity type, said columnar region having a top surface;
    a word line formed on a side wall of said columnar region and insulated therefrom;
    a storage node electrode formed on top of said columnar region and said storage node electrode comprising:
        a first semiconductor layer of said second conductivity type formed on top of said columnar region and in contact with the entire top surface of said columnar region, said first semiconductor layer having a top surfacer; and
        a second semiconductor layer of said second conductivity type formed on top of said first semiconductor layer and in contact with the entire top surface of said first semiconductor layer; and
    a cell plate electrode formed over said storage node electrode, with a capacitor film therebetween;
    wherein said storage node electrode is formed to be relatively thin such that at least a portion of said storage node electrode extends horizontally beyond the side walls of said columnar region.

2. A semiconductor memory device according to claim 1, wherein said storage node electrode comprises a diffusion layer of said second conductivity type formed on a top of said columnar region and a conductive layer electrically connected to said diffusion layer.

3. A semiconductor memory device according to claim 1, wherein said columnar region has a diffusion layer of said second conductivity type electrically connected to said bit line.

4. A semiconductor memory device according to claim 1, wherein an insulating film is formed on a side wall of said columnar region.

5. A semiconductor memory device according to claim 1, wherein an insulating film is provided between said word line and said bit line.

6. A semiconductor memory device according to claim 1, wherein a potential is applied from said substrate to said columnar region through said region of said first conductivity type which fills said opening.

* * * * *